United States Patent
Syue et al.

(10) Patent No.: US 8,932,945 B2
(45) Date of Patent: Jan. 13, 2015

(54) WAFER ALIGNMENT SYSTEM AND METHOD

(75) Inventors: Sen-Hong Syue, Hsin-Chu (TW);
Chung-Chun Ho, Taichung (TW);
Pu-Fang Chen, Hsin-Chu (TW);
Shiang-Bau Wang, Pingzchen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/544,467

(22) Filed: Jul. 9, 2012

(65) Prior Publication Data

US 2014/0011348 A1  Jan. 9, 2014

(51) Int. Cl.
*H01L 21/02* (2006.01)
*H01L 21/762* (2006.01)
*G11B 20/18* (2006.01)
*H01L 29/78* (2006.01)
*H01L 29/68* (2006.01)
*G03F 1/00* (2012.01)
*G03F 1/36* (2012.01)
*G03F 7/20* (2006.01)

(52) U.S. Cl.
CPC ........ *H01L 21/02337* (2013.01); *H01L 21/762* (2013.01); *G11B 20/1833* (2013.01); *H01L 29/7833* (2013.01); *H01L 29/68* (2013.01); *G11B 2020/183* (2013.01); *G11B 2020/1836* (2013.01); *G11B 20/18* (2013.01); *G03F 1/144* (2013.01); *G03F 1/36* (2013.01); *G03F 7/70425* (2013.01)
USPC ...................................................... 438/585

(58) Field of Classification Search
CPC ................. H01L 21/67109; H01L 21/6719; H01L 21/67757; H01L 21/67778; H01L 21/67313; H01L 21/67242; H01L 21/67754; H01L 21/02337; H01L 21/68; G05B 2219/45031; G11B 2020/183; G11B 2020/1836; G11B 20/18; G11B 20/1833; H03M 13/09
USPC ........... 438/973, 975, 778, 782; 414/935–941
See application file for complete search history.

(56) References Cited

U.S. PATENT DOCUMENTS

| | | | | |
|---|---|---|---|---|
| 4,980,747 A | * | 12/1990 | Hutter et al. | 257/513 |
| 5,533,243 A | * | 7/1996 | Asano | 29/25.01 |
| 5,676,869 A | * | 10/1997 | Nakayama et al. | 219/390 |
| 5,788,763 A | | 8/1998 | Hayashi et al. | |
| 6,073,501 A | * | 6/2000 | Rohner | 73/865.8 |
| 6,095,806 A | * | 8/2000 | Suzuki et al. | 432/241 |

(Continued)

OTHER PUBLICATIONS

Laan et al., Etch, Reticle, and Track CD Fingerprint Corrections with Local Dose Compensation, 2005, Proceedings of SPIE vol. 5755, pp. 107-118.*

(Continued)

*Primary Examiner* — Zandra Smith
*Assistant Examiner* — Sophia Nguyen
(74) *Attorney, Agent, or Firm* — Slater & Matsil, L.L.P.

(57) ABSTRACT

A system and method for mitigating annealing fingerprints in semiconductor wafers is provided. An embodiment comprises aligning the semiconductor wafers prior to each annealing step. This alignment generates similar or identical fingerprints in each of the semiconductor wafers manufactured. With the fingerprint known, a single compensation model for a subsequent photoresist may be utilized to compensate for the fingerprint in each of the semiconductor wafers.

19 Claims, 10 Drawing Sheets

(56) References Cited

U.S. PATENT DOCUMENTS

| | | | |
|---|---|---|---|
| 6,168,427 B1 | 1/2001 | Cho et al. | |
| 6,213,708 B1* | 4/2001 | Allen | 414/627 |
| 6,341,935 B1 | 1/2002 | Tseng | |
| 6,369,361 B2* | 4/2002 | Saito et al. | 219/390 |
| 6,435,865 B1 | 8/2002 | Tseng et al. | |
| 6,815,345 B2* | 11/2004 | Zhao et al. | 438/657 |
| 6,829,056 B1* | 12/2004 | Barnes et al. | 356/625 |
| 6,974,653 B2* | 12/2005 | Leung et al. | 430/30 |
| 7,972,979 B2* | 7/2011 | Harada et al. | 438/787 |
| 2003/0207591 A1* | 11/2003 | Lu et al. | 438/770 |
| 2003/0230385 A1* | 12/2003 | Bach et al. | 156/345.49 |
| 2004/0031440 A1 | 2/2004 | Chen et al. | |
| 2005/0075056 A1* | 4/2005 | Wu et al. | 451/57 |
| 2005/0076323 A1* | 4/2005 | Gau et al. | 716/21 |
| 2005/0132306 A1* | 6/2005 | Smith et al. | 716/1 |
| 2006/0138584 A1* | 6/2006 | Ko | 257/500 |
| 2006/0270193 A1* | 11/2006 | Hidaka et al. | 438/459 |
| 2007/0048662 A1* | 3/2007 | Park et al. | 430/270.1 |
| 2007/0172999 A1* | 7/2007 | Kim et al. | 438/149 |
| 2007/0205414 A1* | 9/2007 | Chang et al. | 257/69 |
| 2007/0259285 A1* | 11/2007 | Kaushal et al. | 430/204 |
| 2008/0299739 A1* | 12/2008 | Yoshizawa et al. | 438/424 |
| 2009/0035917 A1* | 2/2009 | Ahn et al. | 438/425 |
| 2009/0090971 A1* | 4/2009 | Chang et al. | 257/351 |
| 2009/0111285 A1* | 4/2009 | Yamazaki et al. | 438/795 |
| 2009/0143876 A1* | 6/2009 | Sugawara et al. | 700/79 |
| 2009/0212014 A1* | 8/2009 | Ohata | 216/58 |
| 2010/0117203 A1* | 5/2010 | Bailey et al. | 257/627 |
| 2010/0135568 A1* | 6/2010 | Preil et al. | 382/144 |
| 2010/0144145 A1* | 6/2010 | Takahata et al. | 438/680 |
| 2010/0148270 A1 | 6/2010 | Golonzka et al. | |
| 2010/0316968 A1* | 12/2010 | Mochizuki et al. | 432/11 |
| 2011/0140112 A1* | 6/2011 | Kim et al. | 257/59 |
| 2011/0222739 A1* | 9/2011 | Zhou et al. | 382/112 |
| 2012/0180983 A1* | 7/2012 | Ishikawa et al. | 165/61 |
| 2012/0189187 A9* | 7/2012 | Preil et al. | 382/144 |
| 2013/0004056 A1* | 1/2013 | Zhou et al. | 382/144 |
| 2013/0038716 A1* | 2/2013 | Cho et al. | 348/126 |
| 2013/0203186 A1* | 8/2013 | Nagai | 438/3 |

OTHER PUBLICATIONS

Buttgereit et al., Mask Tuning for Process Window Improvement, 2011, BACUS News, vol. 27, Issue 10, pp. 1-10.*

"Sorter with Bare Wafer Stocker Option," Rorze, News, Dec. 20, 2010, Copyright 2010, 2 pages, retrieved Jun. 8, 2012 <http://www.rorze.com.tw/newsContent.php?N_id=14>.

Rudawski, et al., "Stressed Multidirectional Solid-Phase Epitaxial Groth of Si," Journal of Applied Physics 105 (2009), Published online Apr. 27, 2009 by the American Institute of Physics, 20 pages.

Crouch, et al., "Creating Unique Identifiers on Field Programmable Gate Arrays Using Natural Processing Variations," IEEE, pp. 579-582 (4 pages), 2008.

Ludwig, "Classification of 'Fingerprints' of Process Control Monitoring-Data with Self-organizing Maps," Proceedings of Engineering Applications of Neural Networks (5 pages), 1997.

* cited by examiner

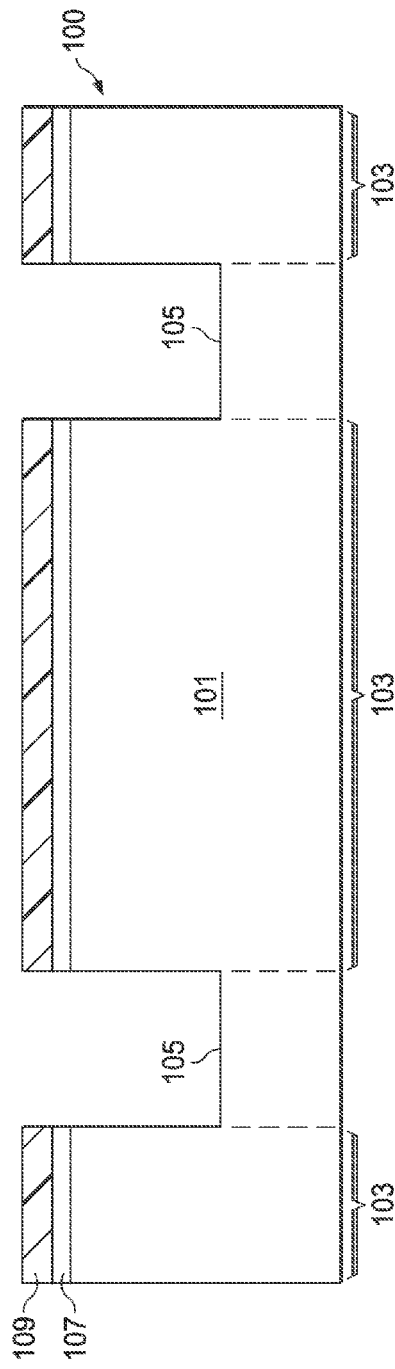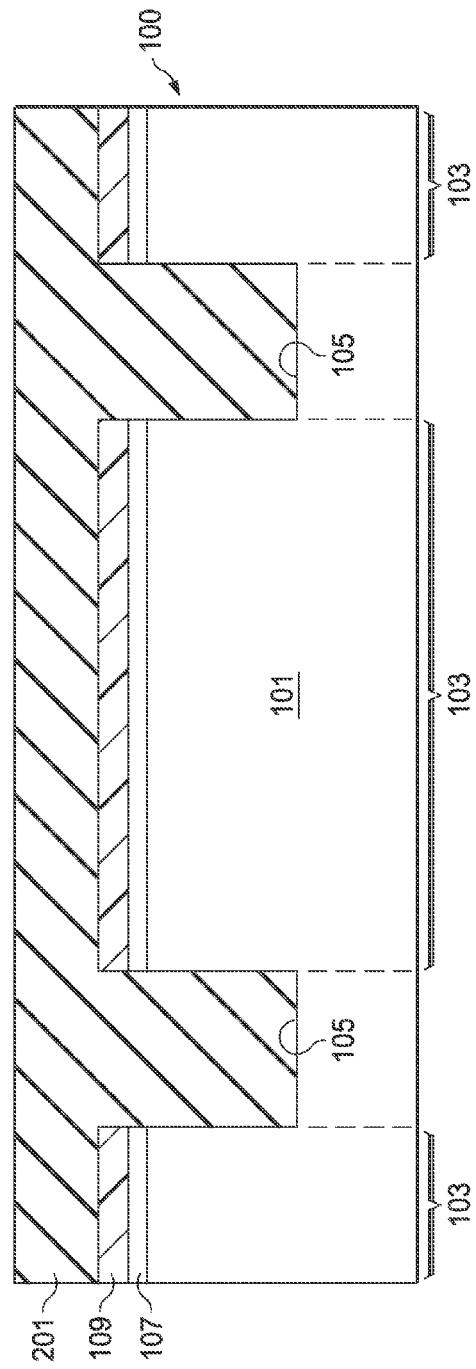

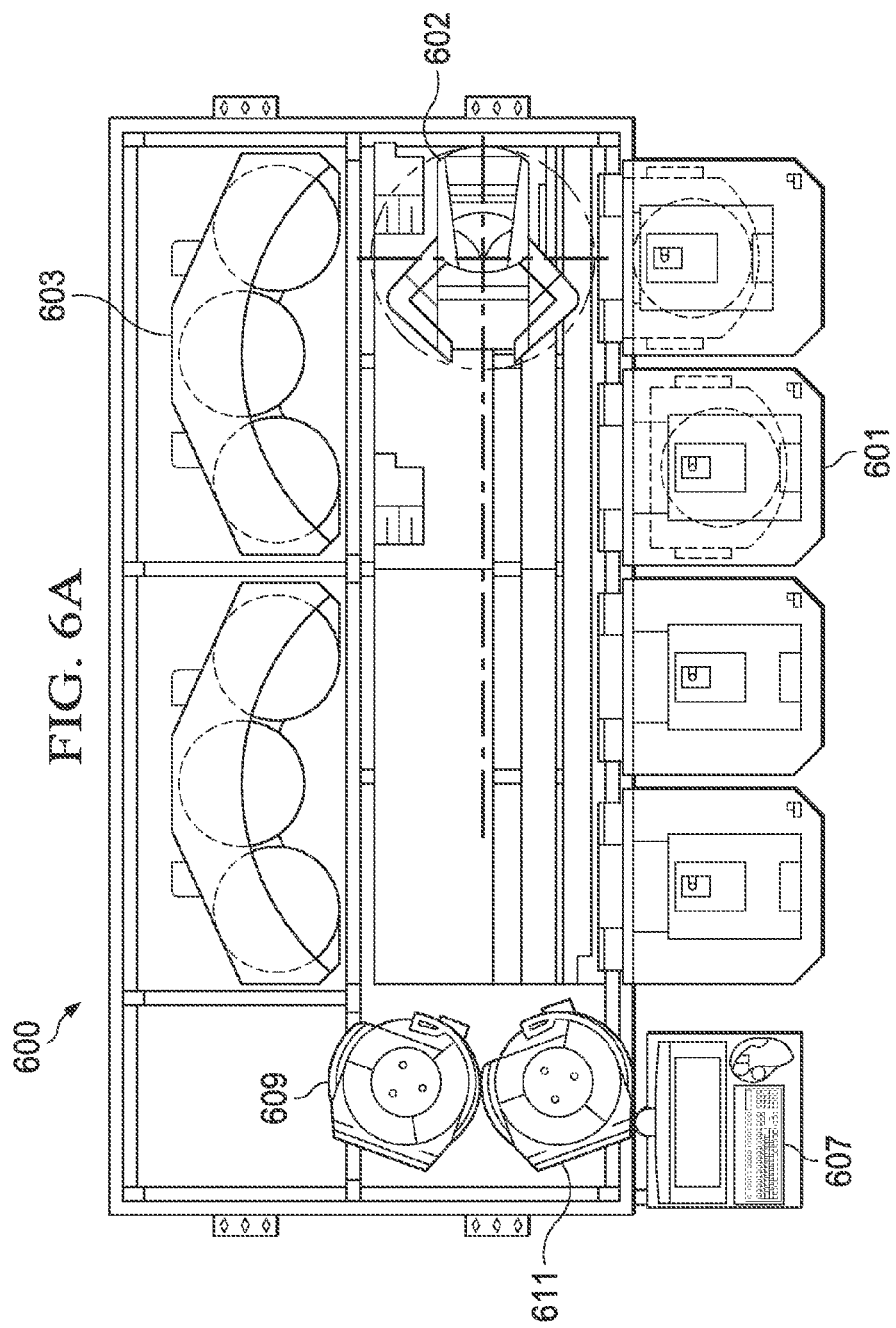

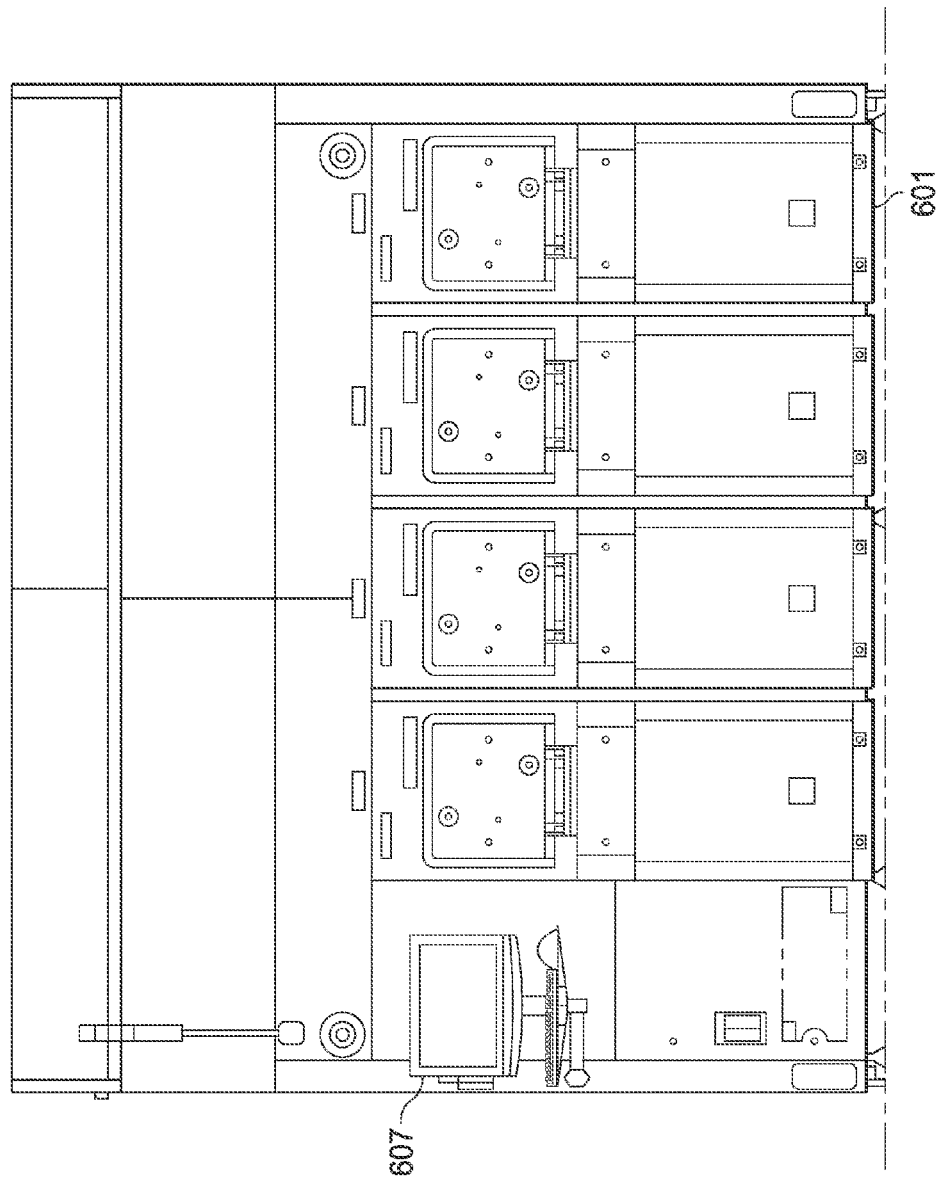

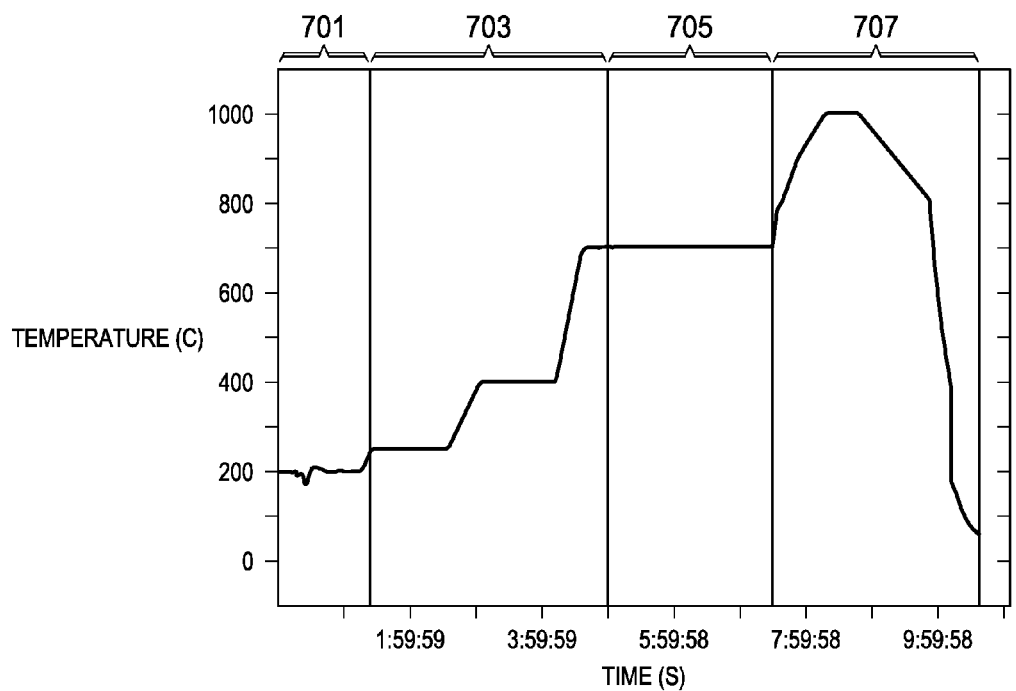
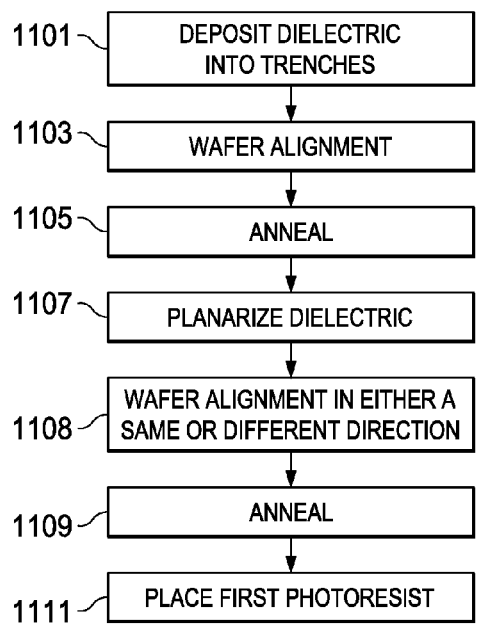

US 8,932,945 B2

WAFER ALIGNMENT SYSTEM AND METHOD

BACKGROUND

Generally, semiconductor devices may be formed on a semiconductor wafer using a variety of processing methodologies. These processing steps may include (among others) such processes as etching processes, deposition processes, implantation processes, planarization processes, plating processes, annealing processes, and/or masking processes. These processes, utilized in combination, may be used to form semiconductor devices such as transistors, resistors, capacitors and other devices and may also be used form interconnections between the devices in order to form functional circuitry within a semiconductor die.

Multiple semiconductor dies may be formed on a single semiconductor wafer. As more semiconductor dies are manufactured for sale, more semiconductor wafers may be processed using similar if not identical processes. By using similar or identical processes, the same semiconductor devices may be formed on multiple semiconductor wafers. Once manufactured, the multiple dies may be singulated from the semiconductor wafers, and similar semiconductor dies may be grouped together and packaged together for sale and eventual shipment to customers.

However, as semiconductor devices and their respective semiconductor dies are scaled down to smaller and smaller sizes, variations in processes that were initially perceived as being similar or identical can actually cause process variations between different semiconductor wafers. Further, as the scaling continues to even smaller and smaller sizes, and the tolerances of the processing parameters becomes tighter and tighter, these process variations may not only begin to affect the processing, but may also actually cause individual semiconductor wafers to vary far enough that undesired deviations from the semiconductor die's desired functionality may occur.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 illustrates a semiconductor wafer with a substrate in accordance with an embodiment;

FIG. 2 illustrates a deposition of dielectric material into trenches of the substrate in accordance with an embodiment;

FIGS. 6A-6C illustrate a sorter that may be utilized to align the semiconductor wafers in accordance with an embodiment;

FIGS. 7A-7B illustrate the placement of the semiconductor wafer into the furnace and an first anneal process in accordance with an embodiment;

FIG. 11 illustrates a process flow in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
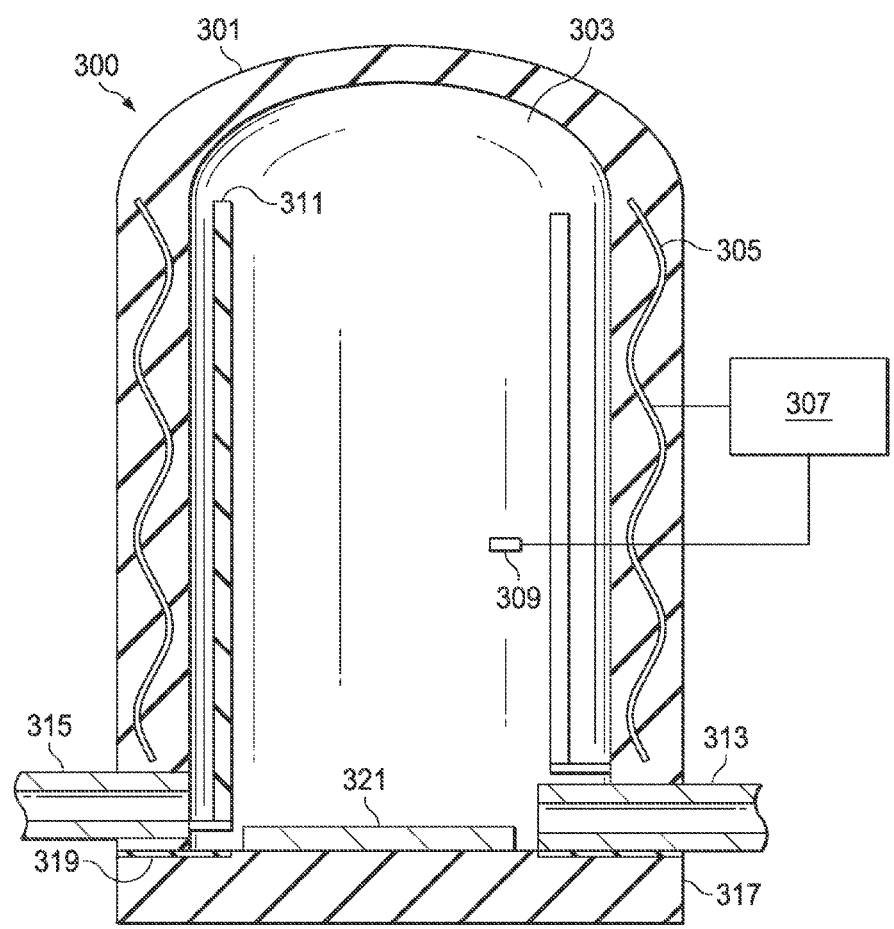
FIG. 3 illustrates a furnace that may be used to anneal the semiconductor wafer in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an alignment process during thermal processing of a semiconductor wafer. Other embodiments may also be applied, however, to other manufacturing processes.

With reference now to FIG. 1, there is shown a simplified cross-sectional view of a portion of a semiconductor wafer 100 with a substrate 101. The semiconductor wafer 100 illustrated in FIG. 1 is one of a plurality of semiconductor wafers 100, the plurality of which are designed with a similar design and will be manufactured using similar or identical processing steps to form similar or identical structures for a particular functionality.

The substrate 101 may comprise a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 101 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof.

The substrate 101 may comprise active areas 103 surrounded by trenches 105. The active areas 103 are areas of the substrate 101 adjacent to the top surface of the substrate 101 into which dopants may be implanted in order to make the active areas 103 conductive. The active areas 103 may be separated from each other by the trenches 105 in order to help isolate the active areas 103. The active areas 103 may be used to form active devices such as transistors, resistors, etc. (described below in greater detail with respect to FIG. 9).

Optionally, a buffer layer 107 may be formed over the substrate 101 and may be used to provide a buffer between the substrate 101 and a masking layer 109. The buffer layer 107 may be a buffering material, such as an oxide like silicon oxide, although any suitable buffering material may be utilized. The buffer layer 107 may be formed through a thermal oxidation of the substrate 101 although any suitable process for forming the buffer layer 107 may be utilized. The buffer layer 107 may be formed to a thickness of between about 50 Å and about 200 Å, such as about 100 Å.

The masking layer 109 may be formed and patterned over the buffer layer 107 and the substrate 101 to protect the active areas 103 while exposing portions of the substrate 101 to assist in the formation of the trenches 105. The masking layer 109 may be formed by depositing a hardmask layer comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer 109 is patterned through a suitable photolithographic process to expose those portions of the substrate 101 as illustrated in FIG. 1.

As one of skill in the art will recognize, however, the processes and materials described above to form the masking layer 109 are not the only method that may be used to protect the active area 103 while exposing portions of the substrate 101 for the formation of the trenches 105. Any suitable process, such as a patterned and developed photoresist, may alternatively be utilized to protect the active area 103 of the substrate 101 while exposing portions of the substrate 101 to be removed to form the trenches 105. All such methods are fully intended to be included in the scope of the present invention.

Once the masking layer 109 has been formed and patterned, the trenches 105 may be formed in the substrate 101. The exposed substrate 101 may be removed through a suitable process such as reactive ion etching (RIE) in order to form the trenches 105 in the substrate 101, although other suitable processes may alternatively be used. The trenches 105 may be formed to be between about 2,400 Å and about 5,000 Å in depth from the surface of the substrate 101, such as about 3,000 Å, and may have an aspect ratio of between about 1 and about 10, such as about 6.

FIG. 2 illustrates a filling and overfilling of the trenches 105 with a dielectric material 201. In an embodiment the dielectric material 201 may be an oxide material, a high-density plasma (HDP) oxide, high density undoped silicate glass (HTUSG), combinations of these, or the like. The dielectric material 201 may be formed using either a chemical vapor deposition (CVD) method, such as the HARP process, a high density plasma CVD method, atmospheric pressure CVD (APCVD), plasma enhanced CVD (PECVD), or other suitable method of formation as is known in the art. The trenches 105 may be filled by overfilling the trenches 105 and the masking layer 109 with the dielectric material 201. The dielectric material 201 may be formed to a thickness of between about 4000 Å and about 8000 Å, such as about 6600 Å, over the surface of the trenches 105.

FIG. 3 illustrates a furnace 300 that may be utilized to perform a first anneal process after the dielectric material 201 has been deposited or otherwise formed in the trenches 105. The furnace 300 may comprise an external body 301 that encloses a central cavity 303. The external body 301 may be shaped as a cylinder with a closed upper end and an open lower end to allow for the introduction and removal of the semiconductor wafer 100 into and out of the furnace 300 (described further below with respect to FIG. 6). The external body 301 of the furnace may be formed from a heat-resistant material such as quartz, silicon-carbide, mullite, combinations of these, or the like in order to retain and redirect thermal energy towards the central cavity 303.

Within the external body 301 a series of heaters 305 controlled by a controller 307 are located. The series of heaters 305 may be utilized to control the temperature within the central cavity 303 and to heat the semiconductor wafers 100 as they reside within the central cavity 303 (discussed further below with respect to FIG. 6). In an embodiment the heaters 305 may be resistive heaters, although any suitable type of heater, such as radiative heaters using steam, radiative heaters using a burning hydrocarbon, or any other suitable element for transferring heat, may alternatively be utilized.

The controller may be, e.g., a computer with a processor, memory, and input/output ports utilized to run a control program to control the heat within the furnace 300. Additionally, the controller 307 may have one or more temperature sensors 309 in order to provide heating information to the controller 307. The temperature sensors 309 may be, e.g., a thermocouple installed within the central cavity 303 to monitor the temperature of the central cavity 303 and adjust the series of heaters 305 accordingly to obtain and maintain the desired annealing temperature. However, any suitable type of sensor may alternatively be utilized to measure the temperature of the central cavity 303 and transmit that measurement to the controller 307.

An inner tube 311 may be placed within the external body 301 and encircling the central cavity 303. The inner tube 311 may a material such as, e.g., quartz, silicon carbide, or mullite. The inner tube 311 may be cylindrical in shape and spaced apart from the external body 301 in order to provide a passage between the inner tube and the external body 301 for process gases to flow.

An inlet 313 and an exit 315 may extend through the external body 301 to provide entrance and exit points for ambient gases to pass into and out of the central cavity 303. The inlet 313 may extend into a bottom region of the central cavity 303 in order to provide fresh ambient gases into the central cavity 303. The exit 315 may only extend through the external body 301, such that the exit 315 opens into the spacing between the external body 301 and the inner tube 311. By placing the inlet 313 and the exit 315 at these locations, the desired ambient gases may be introduced at the bottom of the central cavity 303 (as described further below with respect to FIG. 6), flow upwards through the central cavity 303 within the inner tube 311, flow over the ends of the inner tube 311, down through the spacing between the inner tube 311 and the external body 301, and out through the exit 315. Optionally, a vacuum pump (not individually illustrated in FIG. 3) may be attached to the exit 315 in order to facilitate the removal of the ambient gases from the central cavity 303.

To seal the central cavity 303 from the ambient atmosphere, a base plate 317 may be attached to the external body 301 along the bottom of the external body 301. The base plate 317 may be made from a similar material as the external body 301 (e.g., quartz, silicon carbide, mullite, combinations of these, or the like) and covers the opening at the bottom of the external body 301. A seal ring 319 may be utilized to hermetically seal the central cavity 303 between the external body 301 and the base plate 317.

Attached to the base plate 317 may be a wafer boat connection platform 321. The wafer boat connection platform 321 allows for the placement and connection of a wafer boat 400 (not illustrated in FIG. 3 but illustrated and discussed below with respect to FIG. 4) to the base plate 317. Once attached to the base plate 317, the wafer boat 400 may be placed into the central cavity 303 and be ready for processing.

Figure 4:
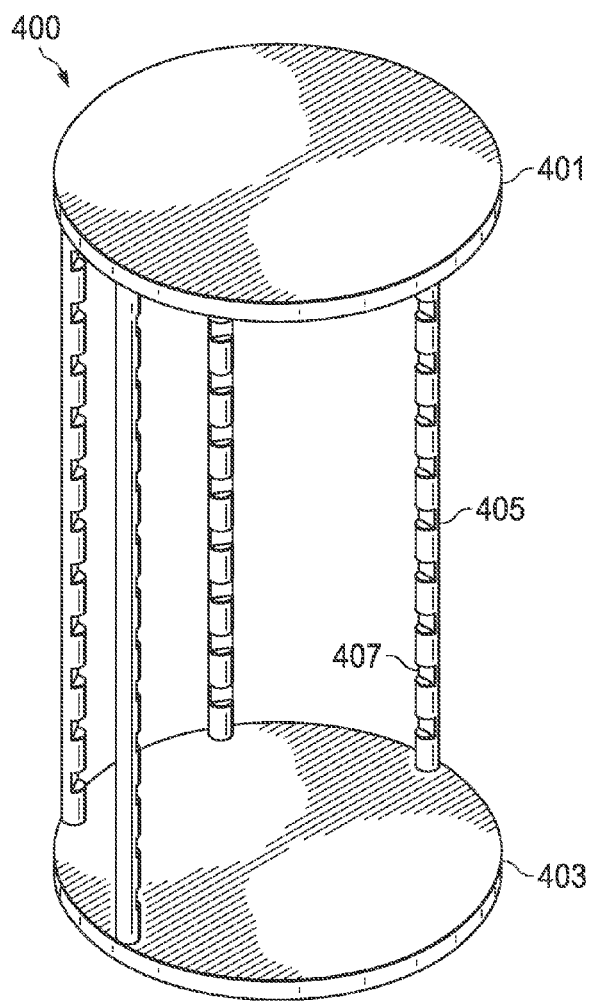
FIG. 4 illustrates a wafer boat and support ring for the semiconductor wafer in accordance with an embodiment.

FIG. 4 illustrates a wafer boat 400 that may be utilized to insert and remove semiconductor wafers such as the semiconductor wafers 100 from the furnace 300. The wafer boat 400 may comprise a top plate 401, a bottom plate 403, and a plurality of support posts 405 extending between the top plate 401 and the bottom plate 403. The top plate 401, the bottom plate 403, and the support posts 405 may all be made from a heat resistant material such as quartz, silicon carbide, mullite, combinations of these, or the like, and the support posts 405 may be attached to the top plate 401 and the bottom plate 403 through a suitable heat resistant method, such as bolting, welding, heat-resistant adhesives, force fits, combinations of these, or the like.

A series of notches 407 may be formed at regular intervals along the support posts 405 to allow the support posts 405 to support the semiconductor wafers 100. Each notch in one of the support posts 405 may be aligned with notches at a similar height in the other support posts 405, thereby providing four support points at each height to support the semiconductor wafer 100 and other wafers. The notches 407 may spaced apart from each other enough to allow the heat from the furnace to evenly heat the semiconductor wafers without significant interference from adjacent wafers within the wafer boat 400.

In an embodiment the wafer boat 400 may have four support posts 405, with each support post 405 comprising twelve notches 407. However, the precise number of support posts 405, the placement of the support posts 405, and the number of notches 407 within the support posts may be varied beyond the embodiments described herein. All such variations are fully intended to be included within the scope of the embodiments.

Figure 5:
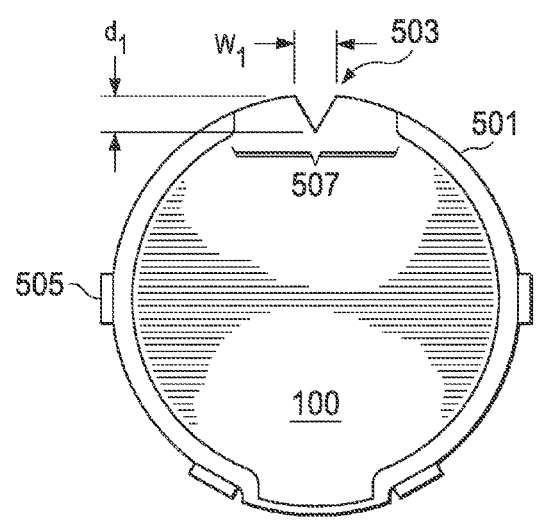
FIG. 5 illustrates a support ring for the semiconductor wafer in accordance with an embodiment.

FIG. 5 illustrates a support ring 501 onto which the semiconductor wafer 100 may be placed. In an embodiment the support ring 501 may be integrated into the notches 407 as part of the wafer boat 400, such that the semiconductor wafer 100 is loaded into the wafer boat 400 at the same time as the semiconductor wafer 100 is placed onto the support ring 501. Alternatively, the support ring 501 may be detachable from the wafer boat 400, the semiconductor wafer 100 may be placed onto the support ring 501 independently from the wafer boat 400, and the semiconductor wafer 100 along with the support ring 501 may be placed together into one set of the notches 407 within the support posts 405 of the wafer boat 400.

The support ring 501 may be, e.g., a C-ring such as the one illustrated in FIG. 5, in which a portion of the support ring 501 has been left open to form an opening 507. However, the support ring 501 may be any suitable shape that may help to provide support to the semiconductor wafers 100 while the semiconductor wafers 100 are within the wafer boat 400. The support ring 501 may be any suitable heat-resistant material such as silicon-carbide, quartz, mullite, combinations of these, or the like.

FIG. 5 also illustrates the placement of one of the semiconductor wafers 100 onto the support ring 501. In this view it can be seen that the semiconductor wafer 100 also has a wafer notch 503 formed on a back side of the semiconductor wafer 100. In an embodiment the wafer notch 503 may have a width $w_1$ of between about 0.2 mm and about 2 mm, may extend into the semiconductor wafer 100 a distance $d_1$ of between about 0.2 mm and about 2 mm, and may have a notch angle of between about 89 and about 95 degrees.

The semiconductor wafer 100 may be placed onto the support ring 501 such that the active area 103 of the semiconductor wafer 100 faces away from the support ring 501, thereby minimizing any thermal interference that the support ring 501 may cause to the dielectric material 201 as it is being heated in the furnace 300. In an embodiment, the semiconductor wafer 100 is merely placed on the support ring 501 and frictional forces are utilized to maintain the semiconductor wafer's 100 position on the support ring 501.

Before or after the placement of the semiconductor wafer 100 on the support ring 501, the semiconductor wafer 100 may be aligned with the support ring 501. This alignment may be performed by a sorter that holds the support ring 501 (or, alternatively, the wafer boat 400 and integrated support ring 501) and, utilizing the wafer notch 503, rotates the semiconductor wafer 100 until the semiconductor wafer 100 is in a particular alignment. In an embodiment in which the support ring 501 is a C-ring, the semiconductor wafer 100 may be aligned such that the wafer notch 503 is in the center of the opening 507 in the support ring 501, although any suitable alignment may be utilized.

The sorter may be a stand-alone unit that may be utilized in conjunction with the furnace 300 in order to align the semiconductor wafers 100 prior to their placement within the wafer boat 400. Alternatively, the sorter may be incorporated into the furnace 300 itself. For example, the sorter may be incorporated into a waiting area of the furnace 300 where the semiconductor wafers 100 are held and placed onto the support rings 501 and then into the wafer boat 400.

Figure 6C:
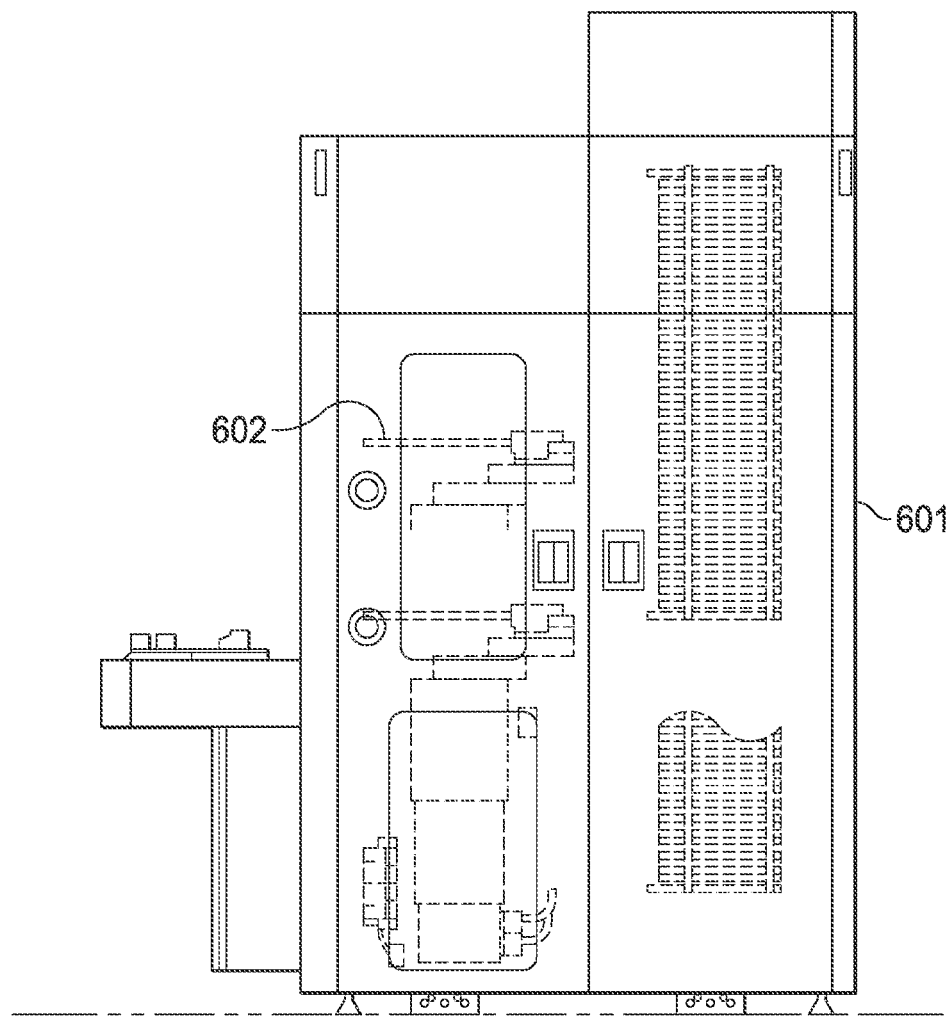

FIGS. 6A-6C illustrate one such example of a stand-alone sorter 600 that may be utilized, which is a BWS600 sorter from Rorze Technology Inc., with FIG. 6A illustrating a top down view of the sorter 600. In an embodiment, the sorter 600 may comprise a series of loadports 601 through which the semiconductor wafer 100 may be loaded into the sorter 600. The sorter 600 may also include wafer stockers 603, a movable portion 605 to move and sort the semiconductor wafers 100 that are placed into the sorter 600, and a control unit 607 which can control the operation of the sorter 600. The sorter 600 may additionally have a dual-arm robot 602 that may be utilized to handle, move, and control the semiconductor wafer 100 during the sorting and aligning processes.

The sorter 600 may additionally have a first aligner 609 and a second aligner 611 integrated into the sorter 600. The first aligner 609 and the second aligner 611 may each be utilized to perform the desired alignment so that the notch 503 within each semiconductor wafer 100 is aligned in the same direction with each other. The first aligner 609 and the second aligner 611 may align the semiconductor wafers 100 by engaging the notch 503 within each of the semiconductor wafers 100 and rotating the semiconductor wafers 100 until the desired position is reached.

FIG. 6B illustrates a side view of the sorter 600 and illustrates the loadports 601 along with the control unit 607. The side view additionally illustrates emergency off (EMO) switches 613 that may be utilized to quickly shut down the sorter 600 if needed. FIG. 6C illustrates a rear view of FIG. 6B, and illustrates the dual arm robot 602 that may be utilized to transfer the semiconductor wafers 100 from the loadports 601.

However, as one of ordinary skill in the art will recognize, the precise machine described above that may be used to align the semiconductor wafers 100 is intended to be illustrative and is not intended to limit the embodiments. Any other suitable method or machine, such as sorters manufactured by Semiconductor Levitation Technologies or even a simple, two armed robot that can adjust the position of the notch 503 as desired, may also be used to align the semiconductor wafers 100. All such methods and machines are fully intended to be included within the scope of the embodiments.

In an embodiment in which the support ring 501 is separable from the wafer boat 400, the support ring 501 along with the semiconductor wafer 100 may be placed into the wafer boat 400 after the semiconductor wafer 100 has been placed onto the support ring 501 and aligned. This placement may be performed automatically, and the alignment of the semiconductor wafer 100 may be maintained by the frictional forces between the semiconductor wafer 100 and the support ring 501. Additionally, as the support ring 501 is being placed within the wafer boat 400, protrusions 505 along a circumference of the support ring 501 will engage with the notches 407 of the wafer boat 400. By having the protrusions 505 engage with the notches 407 of the wafer boat 400, the wafer boat 400 is aligned in a particular direction with the wafer boat 400.

Once the semiconductor wafer 100 has been placed within the wafer boat 400 and aligned with the support ring 501, a similar process may be performed with one or more additional semiconductor wafers 100 that may have the same design and are intended to be similarly processed. This process may be repeated as many times as desired until the wafer boat 400 is full of semiconductor wafers 100 or, if desired, dummy wafers (not individually illustrated).

However, by performing an alignment process for each of the semiconductor wafers 100 with their respective support rings 501, all of the semiconductor wafers 100 will be similarly aligned with respect to their respective support rings 501. Similarly, by placing the support rings 501 into the notches 407 such that the protrusions 505 engage with the notches 407 and the support rings 501 are aligned with each other, all of the semiconductor wafers 100 within the wafer boat 400 are aligned in a similar direction. As such, all of the semiconductor wafers 100 that are intended to be similarly processed may all have a similar alignment for their eventual placement into the furnace 300.

However, while the semiconductor wafers 100 may all be aligned in a single direction, the embodiments are not intended to be limited as such. Rather, the alignment of the semiconductor wafers 100 may be aligned to such a degree that their fingerprints will be similar enough to be able to compensate for all of the fingerprints with a single step. As such, the semiconductor wafers may be aligned to within about 20 degrees of each other while still remaining within the scope of the embodiments.

Alternatively, instead of aligning the semiconductor wafers 100 with respect to their respective support rings 501 prior to placing the support rings 501 into the wafer boat 400, the semiconductor wafers 100 may be aligned with their respective support rings 501 after the semiconductor wafers 100 and support rings 501 have been placed into the wafer boat 400, or after the semiconductor wafers 100 have been placed into the wafer boat 400 with integrated support rings 501. This may allow for a single alignment process performed on all of the semiconductor wafers 100 within the wafer boat 400 instead of an individual process step performed on each of the semiconductor wafers 100 individually.

Figure 7A:
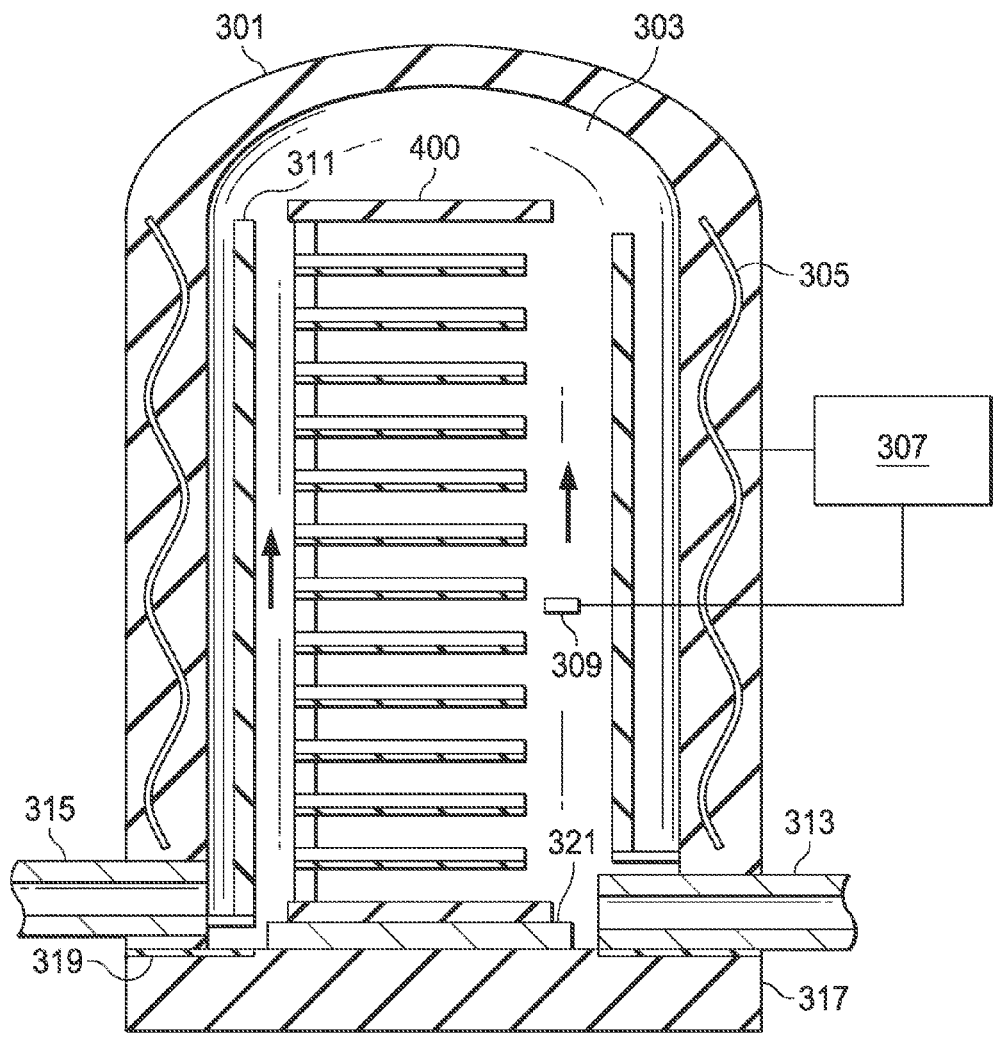

FIG. 7A illustrates that, once all of the semiconductor wafers 100 have been aligned with each other within the wafer boat 400, the wafer boat 400 (along with the semiconductor wafers 100) may be placed onto the wafer boat connection platform 321 on the base plate 317 while the base plate 317 is separated from the external body 301 of the furnace 300. Optionally, the wafer boat 400 may be physically attached to the wafer boat connection platform 321 using, e.g., clamps or other suitable connection devices.

After the wafer boat 400 has been placed on the wafer boat connection platform 321 of the base plate 317, the base plate 317 may be mated with the external body 301 such that the wafer boat 400 and the semiconductor wafers 100 are located within the central cavity 303 of the furnace 300. Once the central cavity 303 is hermetically sealed between the external body 301 and the base plate 317, the controller 307 may engage the heaters 305 to begin heating the central cavity 303 while a desired ambient gas such as argon, nitrogen, helium, neon, water vapor, $NH_3$, oxygen, combinations of these, or the like, may be funneled into the central cavity 303 through the inlet 313, over the wafer boat 400 and the semiconductor wafer 100, and out through the exit 315.

FIG. 7B illustrates one suitable process whereby the heat within the central cavity 303 is transferred to the semiconductor wafer 100 in a first anneal process, thereby annealing the semiconductor wafer 100 and the dielectric material 201 located on the semiconductor wafer 100. In an embodiment the first anneal process may start with a first stage 701 to purge oxygen. The first stage 701 may be performed at a temperature of around 200° C. and a pressure of between about 150 torr and 760 torr.

A second stage 703 of the first anneal process may be performed in an ambient environment of steam and at a pressure of 150 torr to 760 torr. The second stage 703 may also hold the temperature constant at about 250° C. for about one hour and then ramp the temperature to about 400° C. at a change rate of about 5° C./min. After another hour at a constant temperature of 400° C., the second stage 703 may again ramp the temperature to about 700° C. at a rate of about 10° C./min.

A third stage 705 of the first anneal process may be a nitrogen purge. During this purge the semiconductor wafer 100 and the dielectric material 201 may be placed in a nitrogen ambient at a pressure of between about 150 torr and about 760 torr, while the temperature is held constant at 700° C. The nitrogen purge may last for about 1.5 hours.

A fourth stage 707 may include an initial increase in temperature from about 700° C. to about 1000° C. This increase may occur at an initial rate of increase of 10° C./min from about 700° C. to about 800° C., the rate of increase may slow down to about 5° C./min to increase the temperature from about 800° C. and about 900° C., and then the rate of increase may slow down to about 4° C./min to increase the temperature from about 900° C. to about 1000° C. Once the temperature has reached 1000° C., the temperature is held constant for 0.5 hours and at a pressure of about 760 torr in a nitrogen ambient. After the constant temperature of 1000° C., the temperature may be reduced to about 800° C. at a rate of about −3° C./min and then allowed to return to ambient temperature.

However, as one of ordinary skill in the art will recognize, the first anneal process described above and in FIG. 7B is intended to be merely illustrative of one suitable process, and is not intended to limit the embodiments. Alternatively, the first anneal process may be performed at a temperature (controlled by the controller 307) of between about 150° C. and about 1150° C., such as about 1100° C. The ambient gas may be introduced at a flow rate of between about 1 liter/min and about 40 liter/min, such as about 20 liter/min, and the first anneal process may continue for a time of between about 2 hours and about 48 hours, such as about 17 hours.

As the first anneal process is occurring the semiconductor wafers 100 within the furnace 300 will expand, contract, and/or flow as the heat from the annealing process flows into and out of the semiconductor wafers 100. These expansions, contractions, and flows work to generate different stresses at different points within the semiconductor wafers 100. These stresses partially deform the semiconductor wafers 100 into a new shape as the semiconductor wafer 100 is being annealed, known as a fingerprint. This fingerprint can cause wafer to wafer (W2W) and lot-to-lot (L2L) variations that are undesirable.

However, as the semiconductor wafers 100 have all been similarly processed (e.g., they have all similar shapes such as the trenches 105 formed therein), and additionally because the semiconductor wafers 100 have all been aligned in the same direction as each other, heat from the first anneal process will flow into and out of the semiconductor wafers 100 in a similar fashion. As such, the fingerprints of the semiconductor wafers 100 may all be similar.

After the first anneal process, the base plate 317 may be decoupled from the external body 301 and the base plate 317 and external body 301 may be separated from each other. Once the base plate 317 is separated from the external body 301, the wafer boat 400 may be removed from the base plate 317, and (in an embodiment in which the support ring 501 is not integrated into the wafer boat 400) the support ring 501 may be removed from the wafer boat 400. Finally, the semiconductor wafers 100 may be removed from their respective support rings 501 for further processing.

Figure 8:
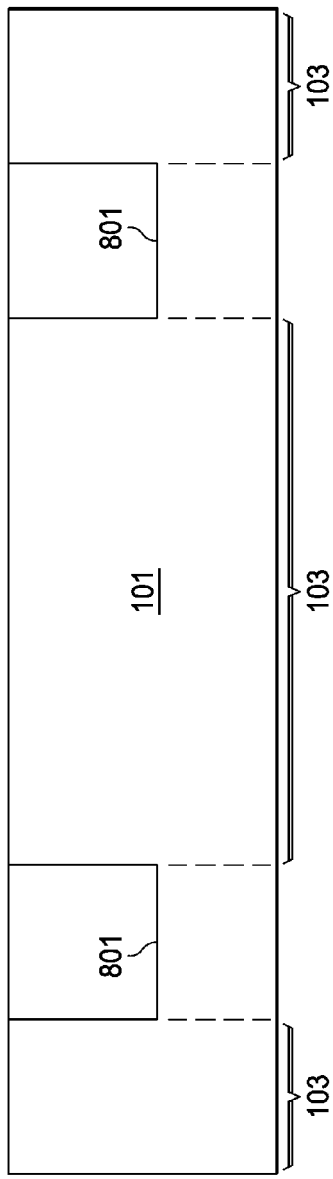
FIG. 8 illustrates a planarization process in accordance with an embodiment.

FIG. 8 illustrates the removal of excess dielectric material 201 located outside of the trenches 105 after the first anneal process to form isolation trenches 801. In an embodiment the excess dielectric material 201 may be removed using a planarization process such as, e.g., a chemical mechanical polishing (CMP) process in which etchants and abrasives are utilized to chemically and mechanically grind the excess dielectric material 201 until the dielectric material 201 is planar with the substrate 101. Additionally, as the CMP process is planarizing the dielectric material 201 with the substrate 101, the buffer layer 107 and the masking layer 109 may also be removed from the surface of the substrate 101, thereby exposing the active areas 103 for further processing.

After the removal of the excess dielectric material 201, semiconductor wafers 100 may be returned to the furnace 300 (or alternatively be placed into a different furnace) so that the isolation trenches 801 may again be annealed in a second anneal process in order to densify the isolation trenches 801. In an embodiment the semiconductor wafers 100 may again be placed onto their respective support rings 501 and the support rings 501 may be placed within the wafer boat 400. Additionally, the semiconductor wafers 100 may be aligned with their respective support rings 501 and each other either before or after being placed within the wafer boat 400 as described above with respect to FIG. 5.

Once the semiconductor wafers 100 have been aligned, the wafer boat 400 may be placed on the wafer boat connection platform 321 and placed within the central cavity 303 for the second anneal process. In an embodiment the second anneal process may be performed at a temperature (controlled by the controller 307) of between about 150° C. and about 1150° C., such as about 1100° C., while an ambient gas such as argon, nitrogen, helium, neon, water vapor, $NH_3$, or oxygen may be introduced at a flow rate of less than about 70 liter/min, such as about 20 liter/min. The second anneal process may continue for a time of between about 2 hours and about 48 hours, such as about 17 hours.

However, as the semiconductor wafers 100 are all aligned with each other in a similar direction during the second anneal process, each of the semiconductor wafers 100 will, again, have a similar fingerprint caused by the second anneal process. If the semiconductor wafers 100 are all aligned in a similar direction as they were during the first anneal process, then the fingerprint from the first anneal process will be enhanced. Alternatively, if the semiconductor wafers 100 are aligned in a different direction for the second anneal process than the first anneal process, then the fingerprint from the second anneal process would change the fingerprint from the first anneal process. However, as all of the semiconductor wafers 100 are aligned together for each anneal, then each of the semiconductor wafers 100 will be affected similarly to each other, and each of the semiconductor wafers 100 will have similar fingerprints at the end of the second anneal process.

After the second anneal process, the base plate 317 may be decoupled from the external body 301 and the base plate 317 and external body 301 may be separated from each other. Once the base plate 317 is separated from the external body 301, the wafer boat 400 may be removed from the base plate 317, the support ring 501 may be removed from the wafer boat 400. Finally, the semiconductor wafers 100 may be removed from their respective support rings 501 for further processing.

However, as one of ordinary skill in the art will immediately recognize, while a thermal anneal in the furnace 300 has been described in the above processes, the embodiments are not limited to the equipment and process conditions as described above. Rather, any suitable annealing process, such as a spike anneal, a flash anneal, a laser anneal, combinations of these, or the like, may alternatively be utilized. These and any other processes which may cause a fingerprint to be generated are fully intended to be included within the scope of the embodiments.

Figure 9:
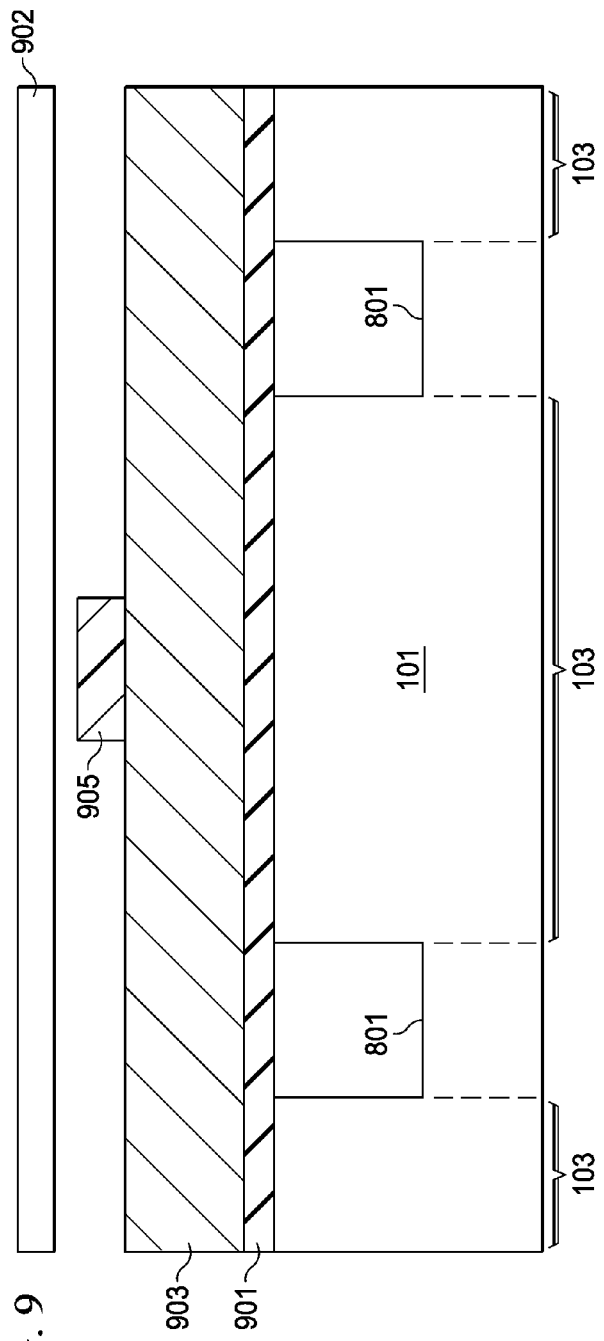
FIG. 9 illustrates a placement of a first photoresist in accordance with an embodiment.

FIG. 9 illustrates the formation of dielectric layer 901, a gate electrode layer 903, and the placement of a first photoresist 905 over the gate electrode layer 903. The dielectric layer 901 may be a high-K dielectric material, such as silicon oxide, silicon oxynitride, silicon nitride, an oxide, a nitrogen-containing oxide, a combination thereof, or the like. In an embodiment the dielectric layer 901 may have a relative permittivity value greater than about 4. Other examples of such materials include aluminum oxide, lanthanum oxide, hafnium oxide, zirconium oxide, hafnium oxynitride, or combinations thereof.

In an embodiment in which the dielectric layer 901 comprises an oxide layer, the dielectric layer 901 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the dielectric layer 901 is between about 8 Å to about 200 Å in thickness.

The gate electrode layer 903 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In an embodiment in which the gate electrode layer 903 is polysilicon, the gate electrode layer 903 may be formed by depositing doped or undoped poly-silicon by low-pressure chemical vapor deposition (LPCVD) to a thickness in the range of about 400 Å to about 2,500 Å, but more preferably about 1,500 Å.

The first photoresist 905 may be deposited on the gate electrode layer 903, and may comprise a conventional photoresist material, such as a deep ultra-violet (DUV) photoresist. The first photoresist 905 may be deposited on the surface of the gate electrode layer 903, for example, by using a spin-on process. However, any other suitable material or method of forming or placing the first photoresist 905 may alternatively be utilized.

Once the first photoresist 905 has been placed, the first photoresist 905 may be exposed to energy, e.g., light, through a patterned reticle 902 in order to induce a reaction in those portions of the first photoresist 905 exposed to the light. The patterned reticle 902, and consequently the pattern of the first photoresist 905, may be modeled in order to compensate for the fingerprint of the semiconductor wafers 100 caused by the first anneal process and the second anneal process. For example, if the fingerprint is determined, then the pattern of the reticle 902 may be adjusted to compensate for the deformation of the fingerprint during the exposure. In an embodiment, the fingerprint of the semiconductor wafer 100 may be modeled by first manufacturing test wafers similar to the semiconductor wafers 100. The test wafers may then be measured and a model of the fingerprint caused by the design and alignment of the test wafers may be determined by, e.g., measuring a measurement point offset in both an X direction and a Y direction from relative to an alignment mark located on each die.

Once a model of the test wafers has been obtained, the model may be utilized to prepare the patterned reticle 902 to compensate for the variations in thickness and other variations of the fingerprint by, e.g., adjusting the location of the light-blocking portions of the reticle. Once a design for the reticle 902 is formed, the design may be transferred to a physical reticle 902, and the first photoresist 905 may be exposed to the energy source through the physical reticle 902.

Once the first photoresist 905 has been patterned, this photoresist process may then be repeated on the other semiconductor wafers 100 being similarly processed. However, because all of the semiconductor wafers 100 have a similar fingerprint, only a single model is needed to adjust for the single fingerprint on the semiconductor wafers 100. As such, time and money may be avoided by not having to prepare and measure multiple test wafers while still allowing for the variations of the fingerprint to be compensated. Additionally, with only a single model is needed, the wafers per hour and advanced process control may be more efficient with only a single model.

As the first photoresist 905 has been exposed to the light source, photoacid generators within the first photoresist 905 may generate an acid in those regions of the first photoresist 905 that is impacted by the energy source. The acid generated by the photoacid generators may then react with other components of the first photoresist 905 to chemically modify those portions of the first photoresist 905 that were exposed to the energy source. Once chemically altered, the first photoresist 905 may be developed by utilizing the differences between the chemically altered sections and the non-chemically altered sections to aid in the removal of one or the other to form either a negative or positive pattern within the first photoresist 905.

Figure 10:
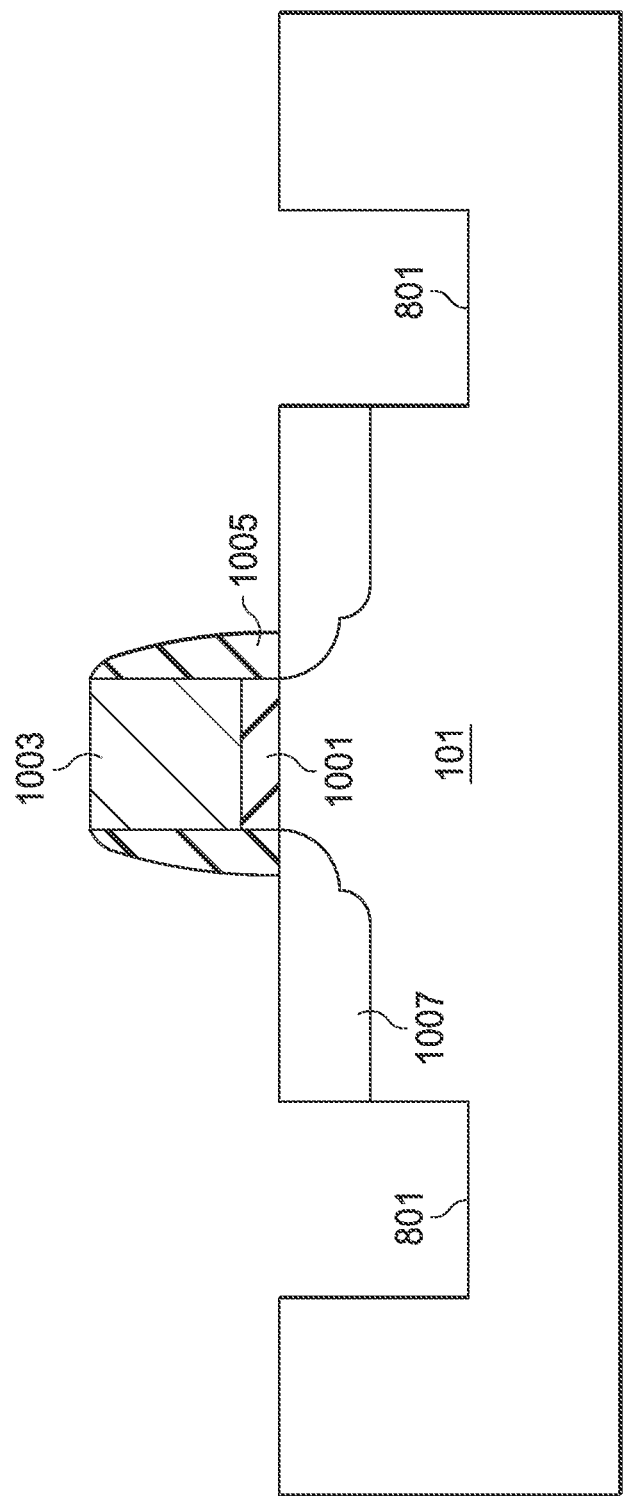
FIG. 10 illustrates further processing to form a transistor in accordance with an embodiment.

FIG. 10 illustrates that, once the first photoresist 905 has been formed, the gate electrode layer 903 and the dielectric layer 901 may be patterned into a gate dielectric 1001 and a gate electrode 1003. The patterning may be performed with one or more etches using the first photoresist 905 as a mask in order to protect that portion of the gate electrode layer 903 and the gate dielectric layer 901 beneath the first photoresist 905 from being removed.

FIG. 9 additionally illustrates the formation of spacers 1005 and source/drain regions 1007. The spacers 1005 may be formed by blanket depositing a spacer layer (not shown) over the previously formed structure. The spacer layer may comprise SiN, oxynitride, SiC, SiON, oxide, combinations of these, and the like and may be formed by commonly used methods such as chemical vapor deposition (CVD), plasma enhanced CVD, sputter, and other methods known in the art. The spacers 1005 are then patterned, such as by anisotropically etching and removing the spacer layer from the horizontal surfaces of the structure.

In an embodiment, the source/drain regions 1007 may be formed by one or more implantations of impurities, such as arsenic or boron, into the substrate 101. The source/drain regions 1007 may be formed such that the device is either an NMOS device or a PMOS device. Because the gate electrode 1003 and spacers 1005 are used as masks, the source/drain regions 1007 are substantially aligned with the gate electrode 1003 and the respective spacers 1005.

It should be noted that, though the above-described process to form source/drain regions 1007 describes a specific process, one of ordinary skill in the art will realize that many other processes, steps, or the like may be used. For example, one of ordinary skill in the art will realize that a plurality of implants may be performed using various combinations of spacers and liners to form source/drain regions 1007 having a specific shape or characteristic suitable for a particular purpose. Any of these processes may be used to form the source/drain regions 1007, and the above description is not meant to limit the present invention to the steps presented above.

FIG. 11 illustrates a flow chart of the alignment process that may be utilized in embodiments. In step 1101 dielectric material 203 may be deposited into the trenches 105. The semiconductor wafer 100 is then aligned in step 1103, and a first anneal is performed in step 1105. Once annealed, the dielectric material 203 is planarized using, e.g., a CMP process in step 1105. Prior to a second anneal process, the semiconductor wafer 100 is again aligned in step 1107, and the second anneal process is performed in step 1109. After the second anneal process, further processing may be performed on the semiconductor wafer 100 and a first photoresist 905 may be used in step 1111 to help compensate for the fingerprints caused by the anneals.

In accordance with an embodiment, a method for manufacturing semiconductor devices comprising aligning a first semiconductor wafer in a first direction and aligning a second semiconductor wafer in the first direction is provided. A first anneal is performed on the first semiconductor wafer and the second semiconductor wafer while the first semiconductor wafer and the second semiconductor wafer are aligned.

In accordance with another embodiment, a method of manufacturing a semiconductor device comprising performing a first processing step on a plurality of semiconductor wafers, wherein each one of the plurality of semiconductor wafers has a respective one of a plurality of alignment notches, is provided. A first alignment of the plurality of alignment notches is performed, the performing the first alignment aligning the plurality of alignment notches in a first direction. A first anneal is performed on the plurality of semiconductor wafers after the performing the first alignment, and a second processing step is performed on the plurality of semiconductor wafers after the performing the first anneal. A second alignment of the plurality of alignment notches in a second direction is performed after the performing the second processing step, and a second anneal on the plurality of semiconductor wafers is performed after the performing the second alignment.

In accordance with yet another embodiment, a method of manufacturing a semiconductor device comprising aligning a first semiconductor wafer and a second semiconductor wafer in a first direction is provided. The first semiconductor wafer and the second semiconductor wafer are annealed for a first time after the aligning the first semiconductor wafer and the second semiconductor wafer in the first direction, and the first semiconductor wafer and the second semiconductor wafer are processed after the annealing for the first time. The first semiconductor wafer and the second semiconductor wafer are aligned in a second direction after the processing the first semiconductor wafer and the second semiconductor wafer, and the first semiconductor wafer and the second semiconductor wafer are annealed for a second time after the aligning the first semiconductor wafer and the second semiconductor wafer in the second direction.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof. As another example, it will be readily understood by those skilled in the art that the precise manufacturing processes utilized between the first anneal and the second anneal may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing semiconductor devices, the method comprising:
   aligning a first semiconductor wafer in a first direction;
   aligning a second semiconductor wafer in the first direction;
   performing a first anneal on the first semiconductor wafer and the second semiconductor wafer while the first semiconductor wafer and the second semiconductor wafer are aligned such that the first anneal creates a first fingerprint on the first semiconductor wafer and a second fingerprint on the second semiconductor wafer, wherein the first fingerprint is similar to the second fingerprint;
   performing a first manufacturing process on the first semiconductor wafer after the performing the first anneal;
   performing the first manufacturing process on the second semiconductor wafer after the performing the first anneal;
   aligning the first semiconductor wafer in a second direction;
   aligning the second semiconductor wafer in the second direction; and
   performing a second anneal on the first semiconductor wafer and the second semiconductor wafer while the first semiconductor wafer and the second semiconductor wafer are aligned, the performing the second anneal occurring after the aligning the first semiconductor wafer and the aligning the second semiconductor wafer;
   placing a first photoresist over the first semiconductor wafer; and
   exposing the first photoresist to an energy source through a patterned reticle, wherein the patterned reticle has a compensation pattern developed from a model of a fingerprint from test wafers to at least partially compensate for the first fingerprint from the first anneal.

2. The method of claim 1, further comprising performing a deposition process on the first semiconductor wafer prior to the aligning the first semiconductor wafer.

3. The method of claim 2, wherein the performing the deposition process deposits a dielectric material into trenches within the first semiconductor wafer.

4. The method of claim 1,
   wherein the compensation pattern also compensates for the fingerprint from the second anneal.

5. The method of claim 4, further comprising:
   depositing a dielectric layer prior to the placing the first photoresist; and
   depositing an electrode layer after the depositing the dielectric layer and prior to the placing the first photoresist.

6. The method of claim 1, wherein the first manufacturing process comprises a chemical mechanical polish.

7. A method of manufacturing a semiconductor device, the method comprising:
   performing a first processing step on a plurality of semiconductor wafers, wherein each one of the plurality of semiconductor wafers has a respective one of a plurality of alignment notches;
   performing a first alignment of the plurality of alignment notches, the performing the first alignment aligning the plurality of alignment notches in a first direction;
   performing a first anneal on the plurality of semiconductor wafers after the performing the first alignment;
   performing a second processing step on the plurality of semiconductor wafers after the performing the first anneal;
   performing a second alignment of the plurality of alignment notches in a second direction after the performing the second processing step;
   performing a second anneal on the plurality of semiconductor wafers after the performing the second alignment, wherein the plurality of semiconductor wafers are aligned after the performing the second alignment such that the second anneal creates a similar fingerprint on each of the plurality of semiconductor wafers;
   generating a model of the fingerprint from the second anneal; and
   preparing a patterned reticle using the model of the fingerprint from the second anneal to compensate for the fingerprint from the second anneal.

8. The method of claim 7, wherein the performing the first processing step further comprises depositing dielectric material into a trench on one of the plurality of semiconductor wafers.

9. The method of claim 8, wherein the performing the second processing step further comprises performing a chemical mechanical polish on one of the plurality of semiconductor wafers.

10. The method of claim 7, wherein the performing the first alignment further comprises aligning the plurality of alignment notches to within 20 degrees of each other.

11. The method of claim 7, wherein the performing the first alignment is performed separately for each one of the plurality of semiconductor wafers.

12. The method of claim 7, wherein the performing the first alignment is performed simultaneously for the plurality of semiconductor wafers.

13. The method of claim 7, wherein the performing the first alignment is performed separately from an annealing device.

14. The method of claim 7, wherein the performing the first alignment is performed within an annealing device.

15. A method of manufacturing a semiconductor device, the method comprising:
   aligning a first semiconductor wafer and a second semiconductor wafer in a first direction;

annealing for a first time the first semiconductor wafer and the second semiconductor wafer after the aligning the first semiconductor wafer and the second semiconductor wafer in the first direction, wherein the annealing for the first time occurs while the first semiconductor wafer and the second semiconductor wafer are aligned such that the first anneal creates a first fingerprint on the first semiconductor wafer and a second fingerprint on the second semiconductor wafer, wherein the first fingerprint is similar to the second fingerprint;

processing the first semiconductor wafer and the second semiconductor wafer after the annealing for the first time;

aligning the first semiconductor wafer and the second semiconductor wafer in a second direction after the processing the first semiconductor wafer and the second semiconductor wafer;

annealing for a second time the first semiconductor wafer and the second semiconductor wafer after the aligning the first semiconductor wafer and the second semiconductor wafer in the second direction and while the first semiconductor wafer and the second semiconductor wafer are aligned such that the annealing for the second time creates a third fingerprint on the first semiconductor wafer and a fourth fingerprint on the second semiconductor wafer, wherein the third fingerprint is similar to the fourth fingerprint; and developing a model of the third fingerprint generated by the annealing for the second time.

16. The method of claim 15, wherein the first direction is the same as the second direction.

17. The method of claim 15, wherein the first direction is different from the second direction.

18. The method of claim 15, further comprising:

placing a first photoresist over the first semiconductor wafer;

exposing the first photoresist to a first energy source through a first reticle, wherein the first reticle has a first pattern that is modeled to compensate for the third fingerprint;

placing a second photoresist over the second semiconductor wafer; and exposing the second photoresist to a second energy source through a second reticle, wherein the second reticle has the first pattern.

19. The method of claim 15, wherein the processing the first semiconductor wafer and the second semiconductor wafer further comprises performing a chemical mechanical polish.

* * * * *